(12) United States Patent
Cabarcos

(10) Patent No.: US 10,806,059 B2
(45) Date of Patent: Oct. 13, 2020

(54) SHIELD BRACKET OF ELECTROMAGNETIC WAVES FOR COMMUNICATION DEVICES

(71) Applicant: Grupo Iron Bridge, S.A., Bahia Blanca, Prov. Buenos Aires (AR)

(72) Inventor: David Cabarcos, Buenos Aires (AR)

( * ) Notice: Subject to any disclaimer, the term of this patent is extended or adjusted under 35 U.S.C. 154(b) by 0 days.

(21) Appl. No.: 15/878,224

(22) Filed: Jan. 23, 2018

(65) Prior Publication Data

US 2018/0235111 A1 Aug. 16, 2018

(30) Foreign Application Priority Data

Jan. 23, 2017 (AR) .............................. 20170100173

(51) Int. Cl.
*H05K 9/00* (2006.01)
*H04B 1/3827* (2015.01)
*H04B 1/3877* (2015.01)
*H04M 1/04* (2006.01)

(52) U.S. Cl.
CPC ......... *H05K 9/0007* (2013.01); *H04B 1/3838* (2013.01); *H04B 1/3877* (2013.01); *H04M 1/04* (2013.01)

(58) Field of Classification Search
CPC ...... H05K 9/0007; H05K 9/00; H05K 9/0009; H05K 9/0045; H04B 1/3838; H04B 1/3877; H04B 1/3888; H04M 1/04
USPC .... 248/459, 248, 300, 152, 174, 247, 441.1; 211/42, 26, 26.1
See application file for complete search history.

(56) References Cited

U.S. PATENT DOCUMENTS

| 4,073,460 | A | * | 2/1978 | Dale | B43M 99/00 248/174 |
| 5,106,047 | A | * | 4/1992 | Baer | A47B 63/00 211/49.1 |
| 5,244,173 | A | * | 9/1993 | Kulyk | H04N 5/64 211/26.1 |
| 5,316,249 | A | * | 5/1994 | Anderson | H01H 9/025 211/26.1 |
| 8,616,327 | B1 | * | 12/2013 | Palacios | H04M 1/035 181/175 |
| 2003/0205649 | A1 | * | 11/2003 | Saluccio | H04B 1/3833 248/176.1 |
| 2014/0153182 | A1 | * | 6/2014 | North | G06F 1/1632 361/679.41 |
| 2015/0129722 | A1 | * | 5/2015 | Green | F16M 13/02 248/51 |
| 2016/0109060 | A1 | * | 4/2016 | Blair | A47G 29/00 248/231.81 |

(Continued)

*Primary Examiner* — Christopher Garft
(74) *Attorney, Agent, or Firm* — Albert Bordas, P.A.

(57) ABSTRACT

The shield bracket refers to a shield bracket of open enclosure (2) delimited by a support structure (1) equipped with a main wall of support (3) and a containment structure (4), which is prepared to receive and serve as a support for communication devices (100), such as cell phones; the entire structure (1) or at least its walls of side screen (5), which are projected beyond the open enclosure (2), are structured in aluminum and therefore constitute barriers to the emission of electromagnetic waves coming from the devices (100) which support. Thus, this limits the emission zone (Z1) of these electromagnetic waves issued by the device of communication (100) and creates a wide area of the protection zone (Z2).

9 Claims, 20 Drawing Sheets

(56) References Cited

U.S. PATENT DOCUMENTS

2016/0134320 A1* 5/2016 Schaar ................ H04B 1/3838
  455/575.5
2016/0183393 A1* 6/2016 Groom ..................... F16B 1/00
  280/33.992

* cited by examiner

SHIELD BRACKET OF ELECTROMAGNETIC WAVES FOR COMMUNICATION DEVICES

BACKGROUND OF THE INVENTION

1. Field of the Invention

The present invention relates to brackets with protection shields for devices that issue electromagnetic waves, and more particularly, to a shield bracket of electromagnetic waves for communication devices, which structure allows a user to support devices such as cell phones and blocks the emission of the electromagnetic waves toward most of the surrounding area.

2. Other Related Applications

The present application claims the priority of pending Argentinian Patent Application No. AR MU20170100173, filed on Jan. 23, 2017, which is hereby incorporated by reference.

3. Description of the Related Art

There are studies and opinions warning over the possible harmful effects on human health of radiation exposures at lower scale. While the studies results do not coincide, agencies such as the World Health Organization WHO recommends taking precautions in this regard.

Experts consider that radiation at lower scale may be associated to the use of electronic devices such as cell phones. Also, the WHO has recommended the adoption of simple measures of protection such as the presence of barriers around the sources of intense electromagnetic fields. This will help to decrease the exposure to lower scale radiation.

However, until the present time, there are no known simple and easy to use devices that help to receive the above-mentioned protection.

Applicant believes that the closest reference corresponds to Chinese Patent Document No. CN202365064, published in 2011 to Cao Na, et al. for Radiation-proof mobile phone box. However, it differs from the present invention because Cao Na, et al. teaches a portable receptacle, holster, with semi cylindrical walls that include a metallic mesh for protection.

Applicant is not aware of any protective cell phone housing that block the emission of waves toward its surrounding areas.

Applicant believes that one of the closest references corresponds to Chinese Patent Document No. CN202365064, published in 2011 to Cao Na, et al. for Radiation-proof mobile phone box. However, it differs from the present invention because Cao Na, et al. teaches a portable receptacle, holster, with semi cylindrical walls that include a metallic mesh for protection.

Other patents describing the closest subject matter provide for a number of more or less complicated features that fail to solve the problem in an efficient and economical way. None of these patents suggest the novel features of the present invention.

SUMMARY OF THE INVENTION

The instant invention is a shield bracket of electromagnetic waves for communication devices, comprising an open receptacle structured to house and support a communication device; a main supporting wall having first and second side ends, an open edge and an end, the end being opposite to the open edge; a containment structure comprising an end supporting wall, the end supporting wall being connected to the end of the main supporting wall, the main supporting wall having a sloping angle that tilts to the containment structure; first and second sidewalls having respective upper edges, each of the first and second sidewalls further having first and second lateral ends, the first and second sidewalls extending upwardly from the main supporting wall at divergent angles, and the first and second sidewalls extending beyond a first height of the containment structure, the first and second sidewalls are made of aluminum; and first and second leg walls, the first leg wall extending from the open edge, the second leg wall extending from the end supporting wall, the second leg wall being shorter than the first leg wall, the sloping angle is defined by a second height of the first leg wall and a third height of the second leg wall, a fourth and fifth height of respective first and second sidewalls and the divergent angles define an electromagnetic wave protection zone.

The present shield bracket of electromagnetic waves for communication devices is further characterized in that the end supporting wall comprises a connection passage. Also, the open receptacle further comprises an aperture defined by the first and second lateral ends of the first and second sidewalls respectively and the open edge of the main supporting wall. The main supporting wall and the containment structure are made of aluminum, the aluminum is aluminum series 1000, and the aluminum series 1000 is aluminum 1100 of a thickness in the range of 1.2-2.5 mm.

The divergent angles are defined by a first angle between the first sidewall with respect to the main supporting wall and a second angle between the second sidewall with respect to the main supporting wall, whereby the divergent angles are in the range of 93°-130° to define a lateral manipulation space.

The shield bracket of electromagnetic waves for communication devices may be made from an aluminum laminar sheet being cut and formed with lines of fold to configure the main supporting wall folded to form the first and second sidewalls, the first and second leg walls and the end supporting wall.

The first and second sidewalls are fixed to the first and second side ends respectively and the first and second upper edges are of a convex shape.

The shield bracket of electromagnetic waves for communication devices further comprises a partial cover wall defining a housing for the lower portion of the communication device, a charging connector and a cable connected to the communication device, the partial cover wall is secured to the respective upper edges of the first and second sidewalls.

The shield bracket of electromagnetic waves for communication devices further includes removable means for mounting to structures, walls, furniture or vehicles, and protection covering materials including plastics, rubber or paint.

It is therefore one of the main objects of the present invention to provide a shield bracket of electromagnetic waves for communication devices that houses a cell phone in locations such as nightstand tables, desks, tables, shelves, coffee tables, etc.

It is another object of this invention to provide a shield bracket of electromagnetic waves for communication devices having a simple support structure combined with the side screen walls that extend longitudinally by the side edges of the main supporting wall, thus increasing the adjacent side of the protection zone.

It is another object of this invention to provide a shield bracket of electromagnetic waves for communication devices, which side screen walls have a certain inclination that, without substantially affecting the protection zone adjacent to it, allows the user to easily manipulate the device, both to place it in and out of the invention.

It is another object of this invention to provide a shield bracket of electromagnetic waves for communication devices having a simple structure based on a main supporting wall, legs of different heights that determine the inclination or tilt, a containment structure for the lower support and walls erected at screen sideways.

It is another object of this invention to provide a shield bracket of electromagnetic waves for communication devices structurally made from a laminar sheet cut and formed with lines of fold.

It is another object of this invention to provide a shield bracket of electromagnetic waves for communication devices having walls comprising aluminum making the invention lightweight.

It is another object of this invention to provide a shield bracket of electromagnetic waves for communication devices that have a passage connection for the entry of a power cord, thus allowing to charge the batteries of the supported device.

It is another object of this invention to provide a shield bracket of electromagnetic waves for communication devices that is volumetrically efficient for carrying, transporting, and storage.

It is another object of this invention to provide a shield bracket of electromagnetic waves for communication devices that can be readily assembled and disassembled without the need of any special tools.

It is another object of this invention to provide a shield bracket of electromagnetic waves for communication devices, which is of a durable and reliable construction.

It is yet another object of this invention to provide such a device that is inexpensive to manufacture and maintain while retaining its effectiveness.

Further objects of the invention will be brought out in the following part of the specification, wherein detailed description is for the purpose of fully disclosing the invention without placing limitations thereon.

BRIEF DESCRIPTION OF THE DRAWINGS

With the above and other related objects in view, the invention consists in the details of construction and combination of parts as will be more fully understood from the following description, when read in conjunction with the accompanying drawings in which.

View A is a perspective view of the present shield bracket of electromagnetic waves for communication devices, in a embodiment wherein the open the enclosure is bounded by the walls of side screen, the main wall and the extreme edge of complementary support;

View B, is a side elevational view of the invention; and

View C, is a rear elevational view of the invention indicating the protection zones and areas of emission of electromagnetic waves.

Figure 2:
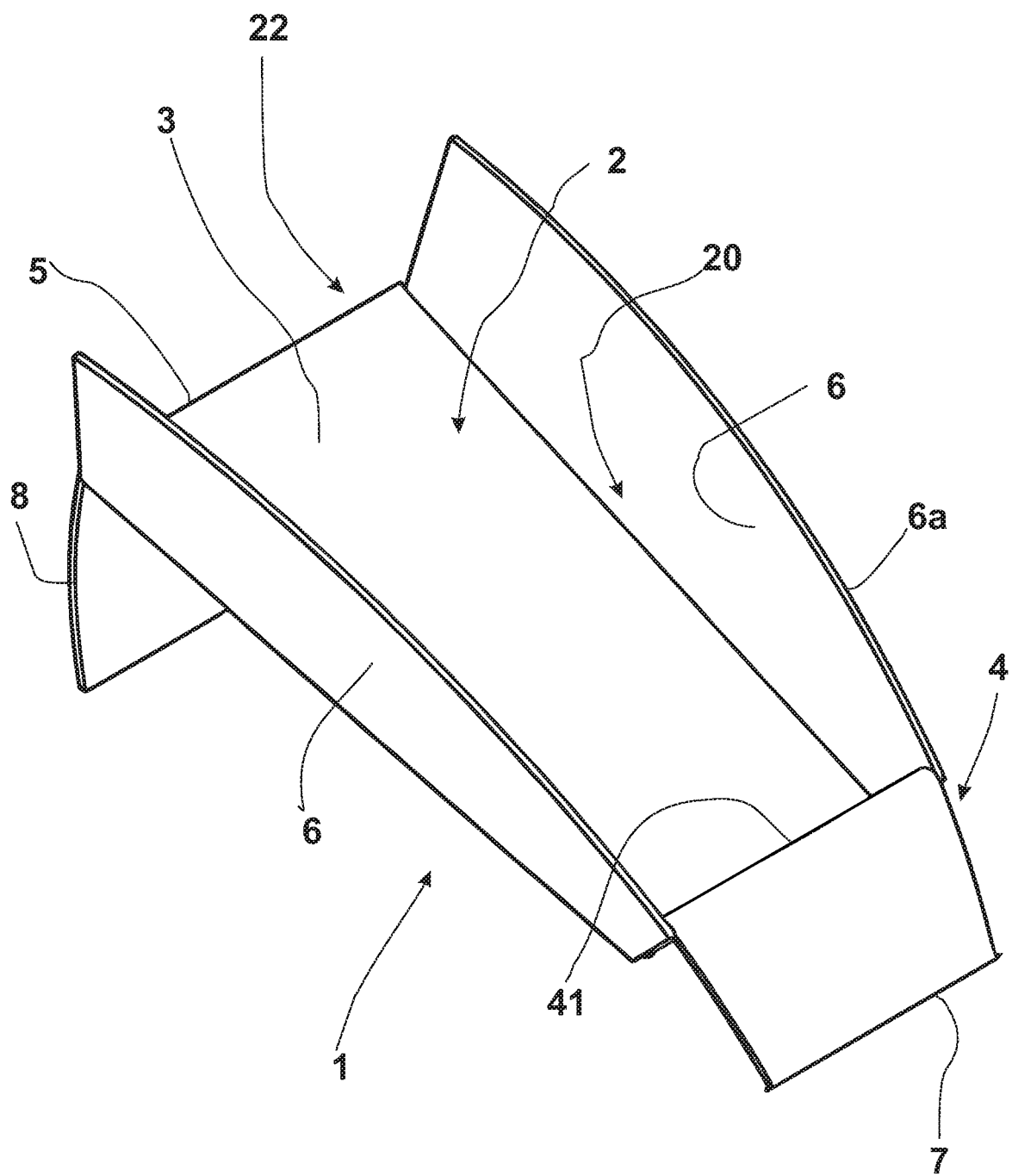

FIG. 2 is a perspective view of the invention.

Figure 3:
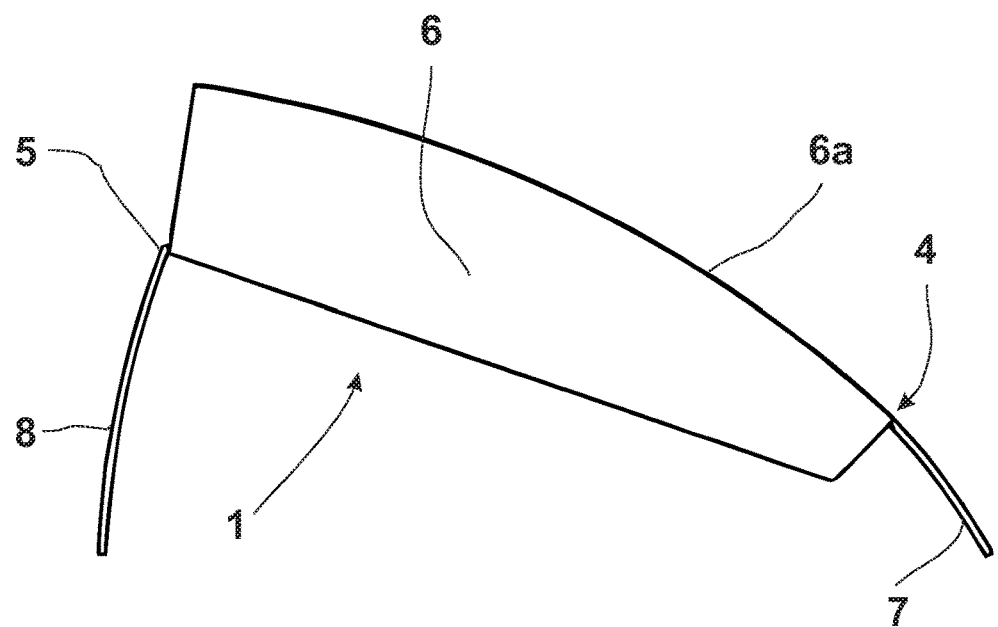

FIG. 3 is a side elevational view of the invention showing the shape of its side screen walls.

Figure 4:
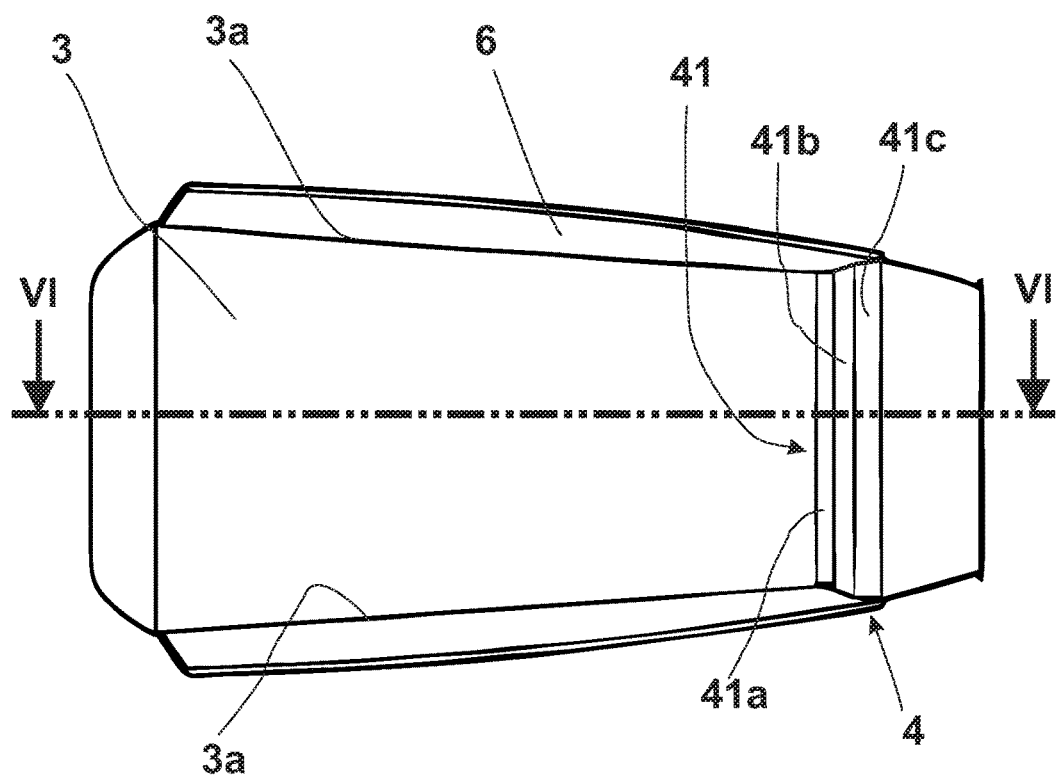

FIG. 4 is a top view of the invention showing the shape of the different walls extending from the main support wall.

Figure 5:
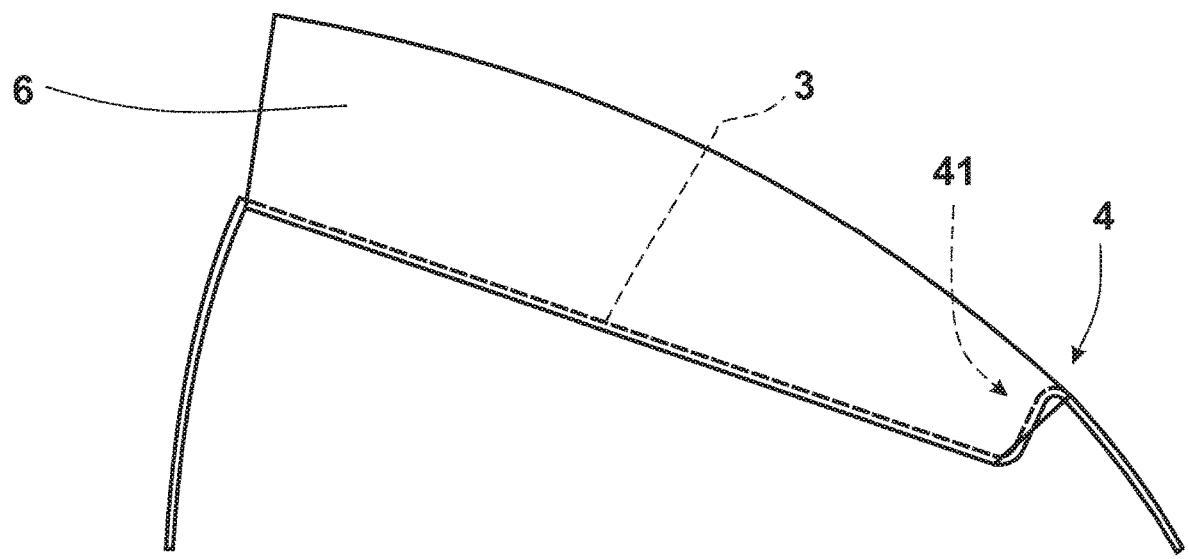

FIG. 5 is a side elevational view of the invention.

Figure 6:
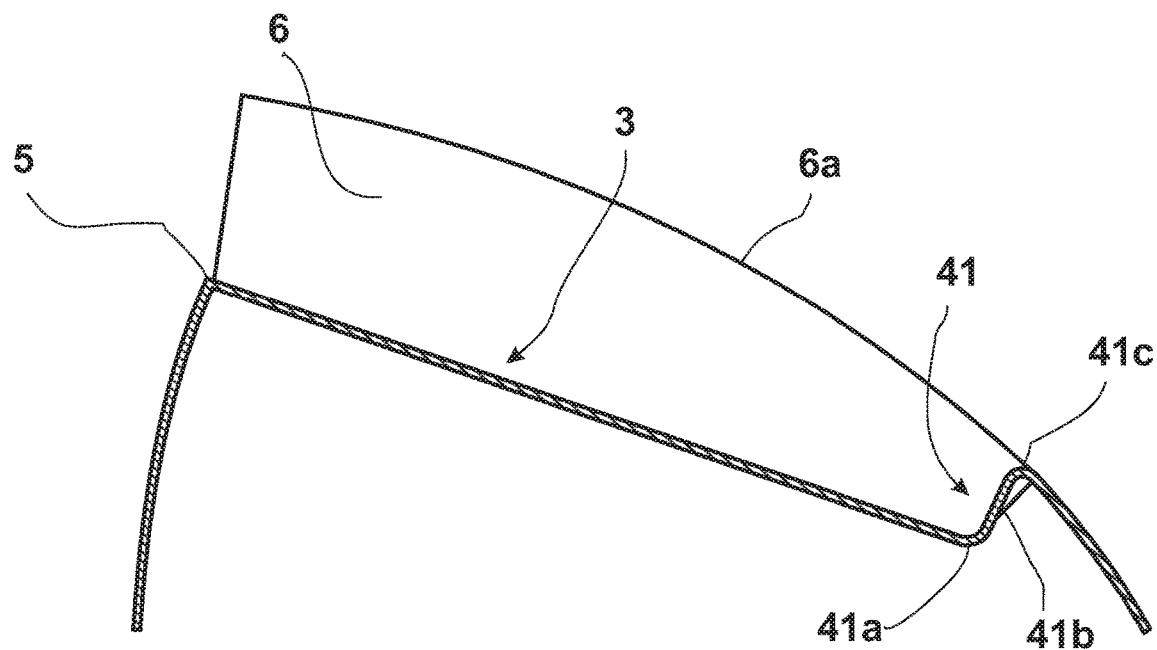

FIG. 6 is a cross-section view taking along line VI-VI from FIG. 4.

Figure 7:
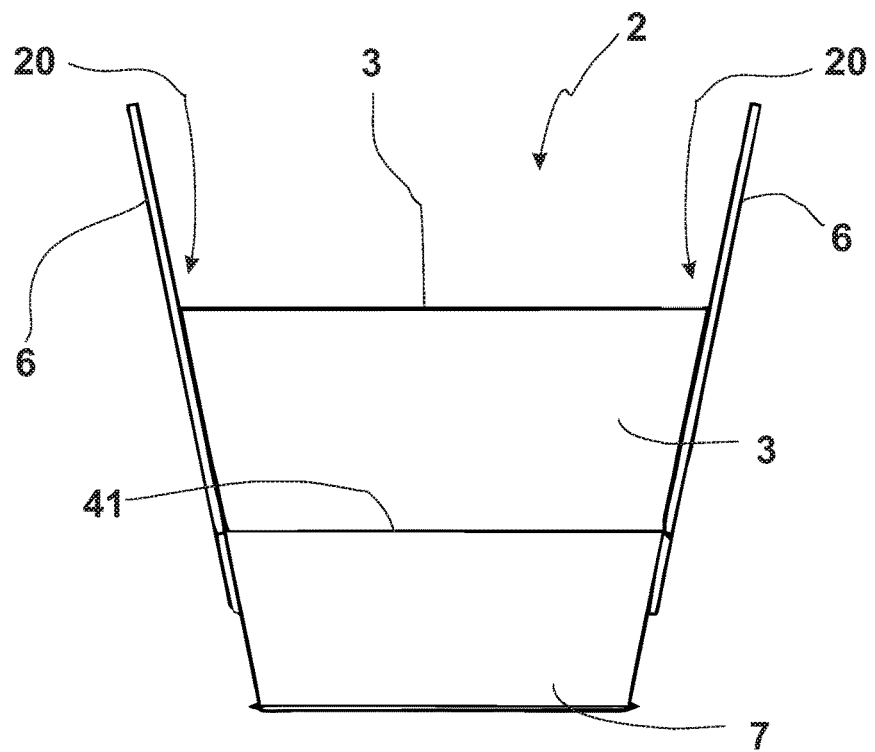

FIG. 7 is a rear elevational view of the invention.

Figure 8:
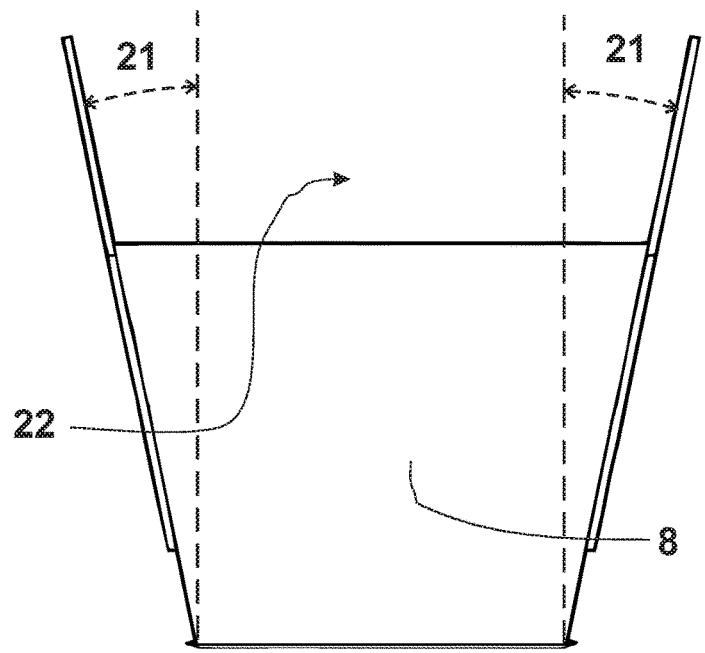

FIG. 8 is substantially the same rear elevational view shown in FIG. 7 with angles marked.

Figure 9:
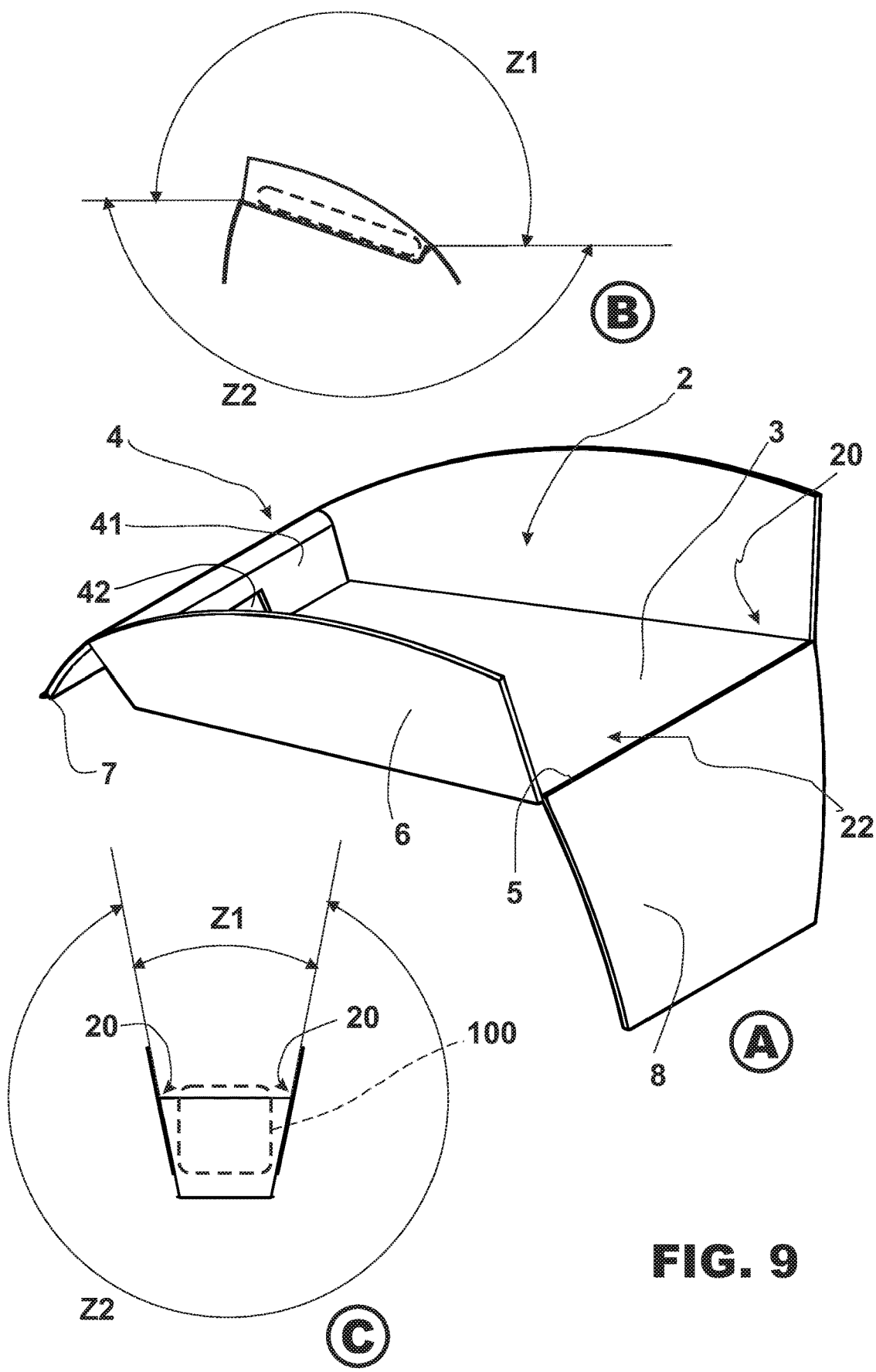

FIG. 9 represents a first alternate embodiment of the present invention, including A, B, and C, showing:

View A is a perspective view of a first alternate embodiment for the present shield bracket of electromagnetic waves for communication devices, in which its support edge comprises a passage for connection;

View B, is a side elevational view of the first alternate embodiment for the present invention represented in view A; and View C, is a rear elevational view of the first alternate embodiment for the present invention indicating the protection zones and areas of emission of electromagnetic waves.

Figure 10:
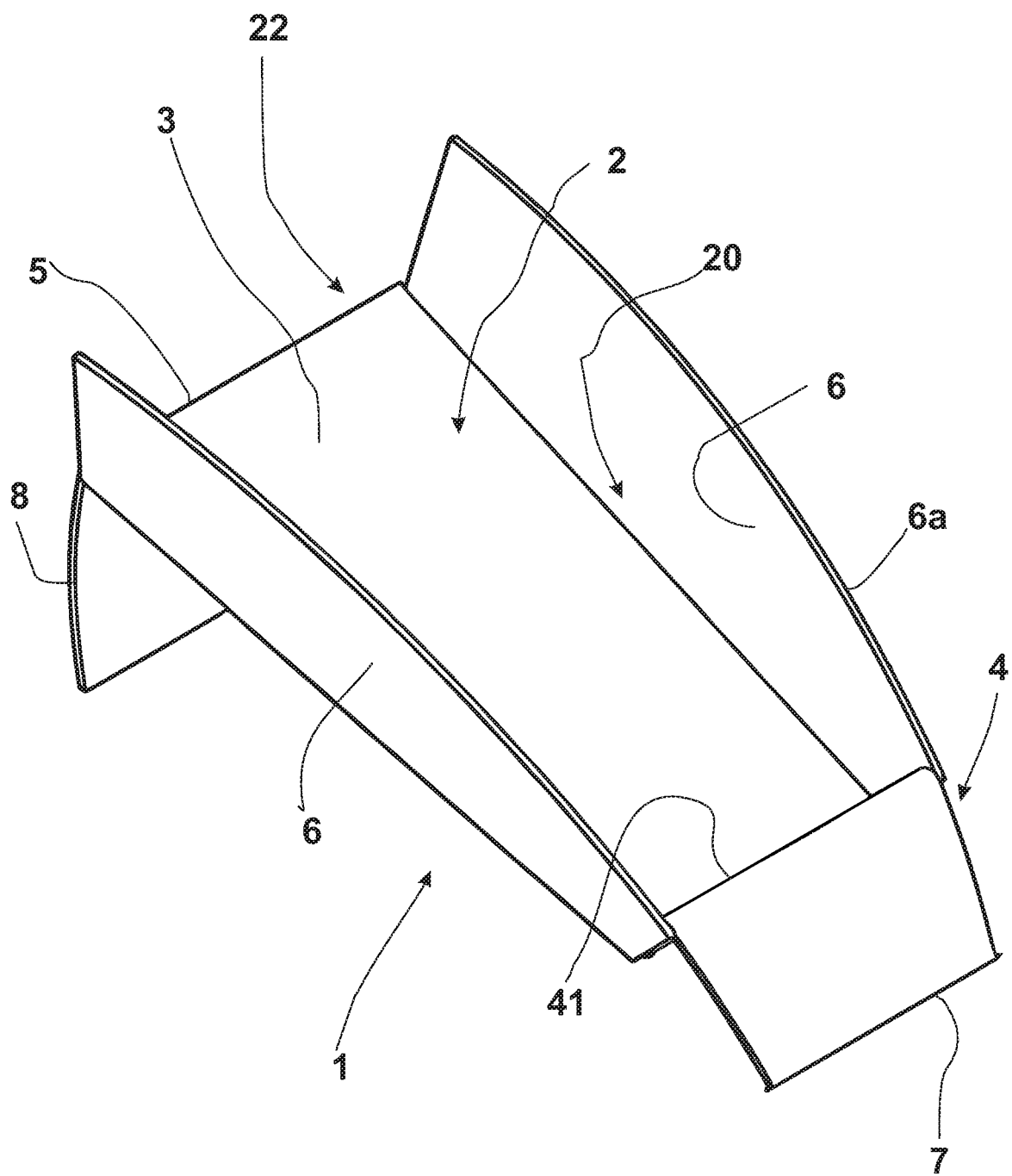

FIG. 10 is a perspective view of the first alternate embodiment for the present invention.

Figure 11:
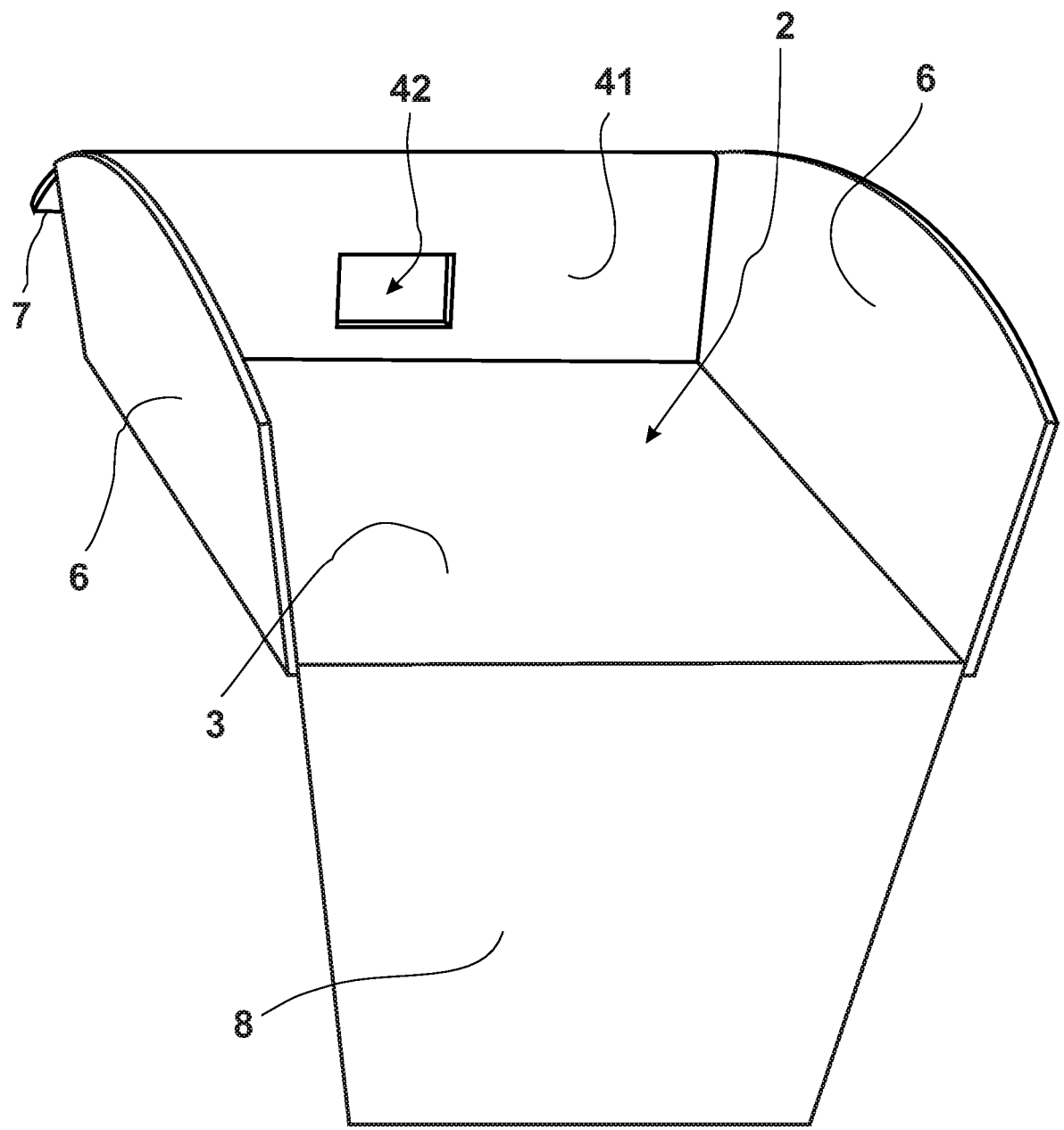

FIG. 11 is a front perspective view of the first alternate embodiment for the present invention.

Figure 12:
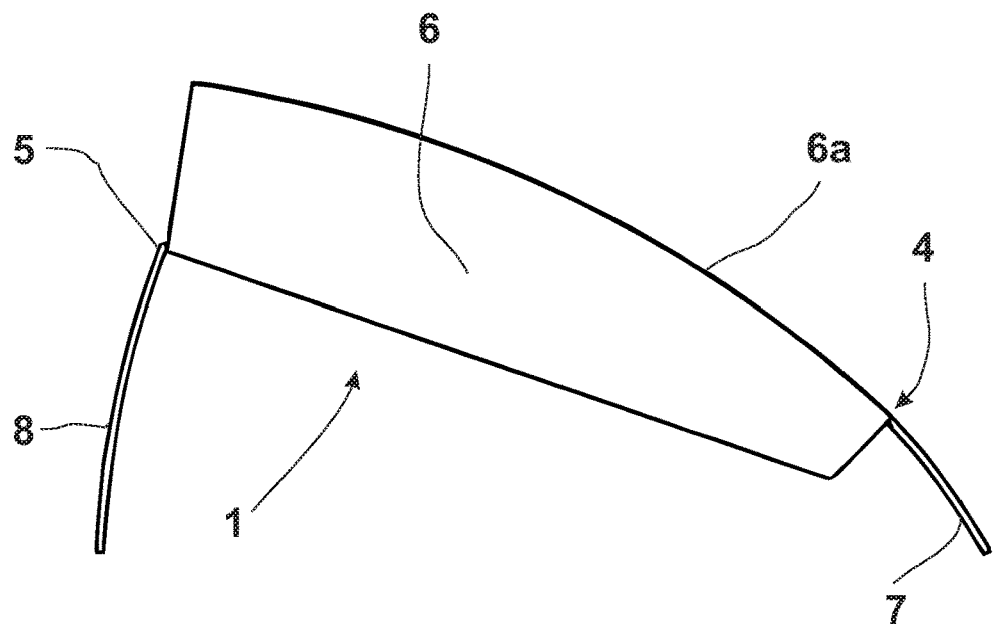

FIG. 12 is a side elevational view of the first alternate embodiment for the present invention showing the shape of its side screen walls.

Figure 13:
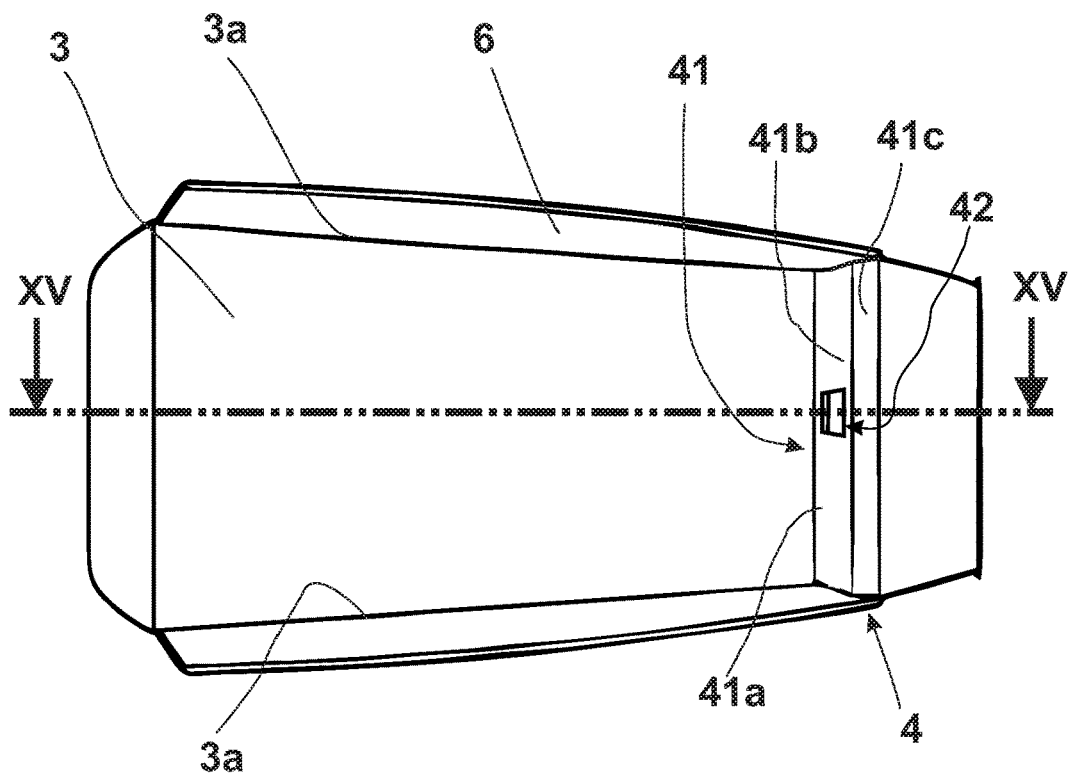

FIG. 13 is a top view of the first alternate embodiment for the present invention showing the shape of the different walls extending from the main support wall.

Figure 14:
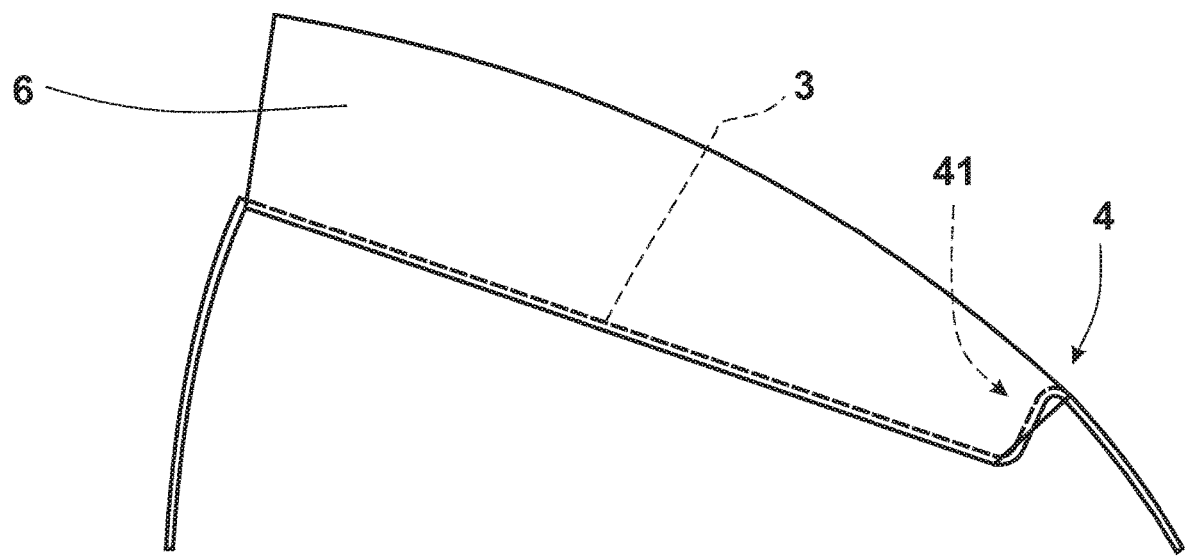

FIG. 14 is a side elevational view of the first alternate embodiment for the present invention.

Figure 15:
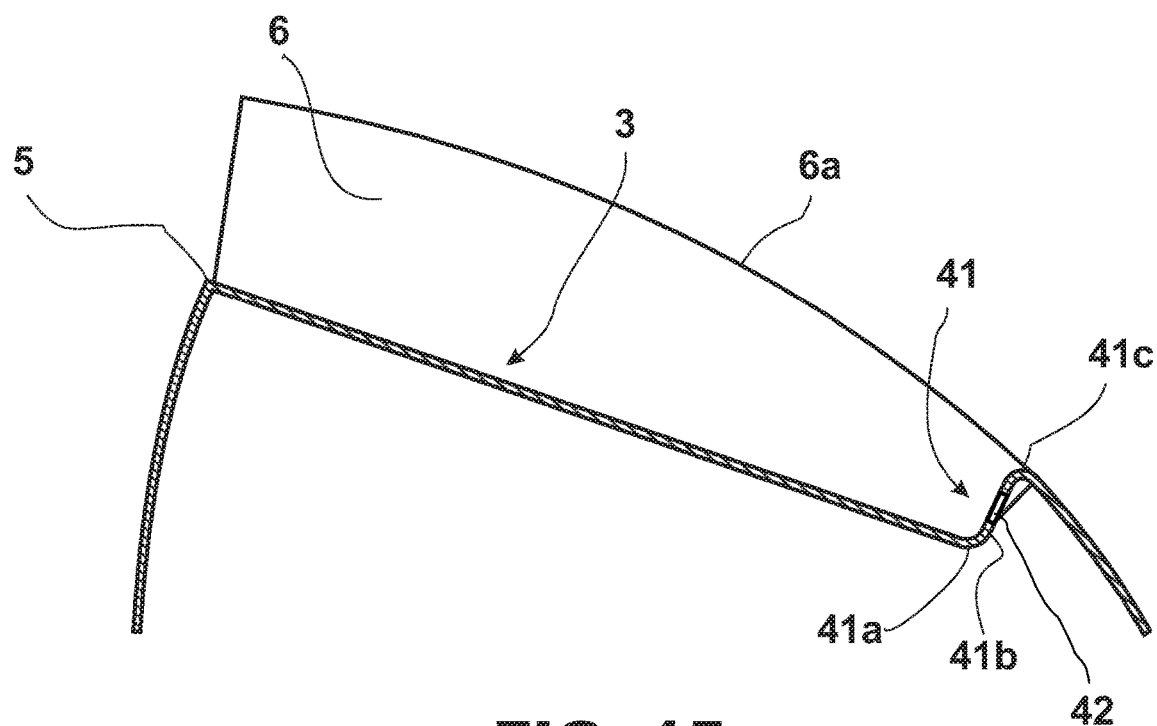

FIG. 15 is a cross-section view taking along line XV-XV from FIG. 13.

Figure 16:
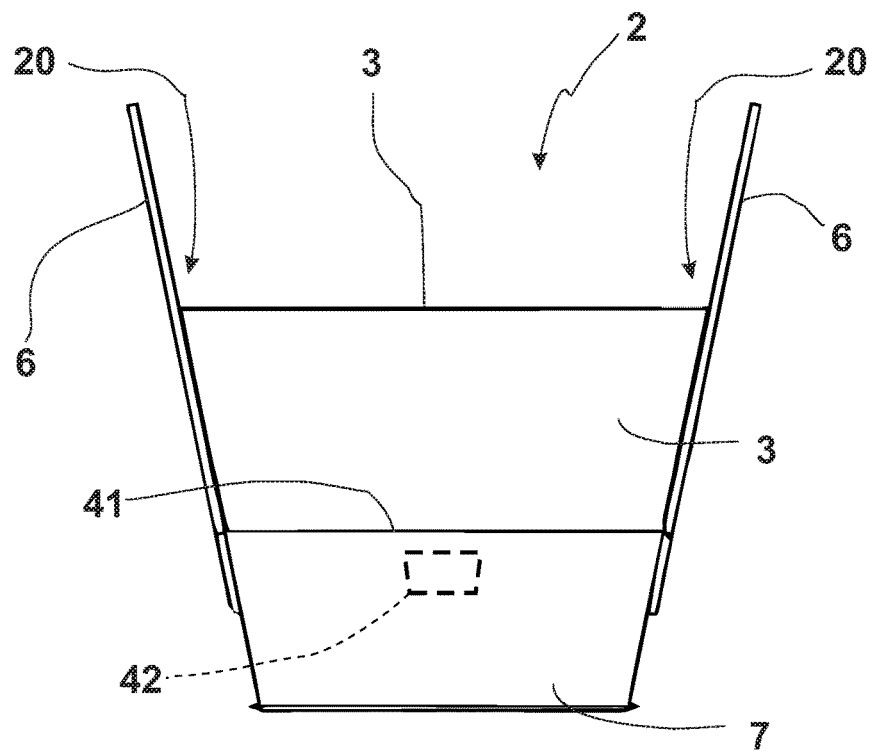

FIG. 16 is a rear elevational view of the first alternate embodiment for the present invention.

Figure 17:
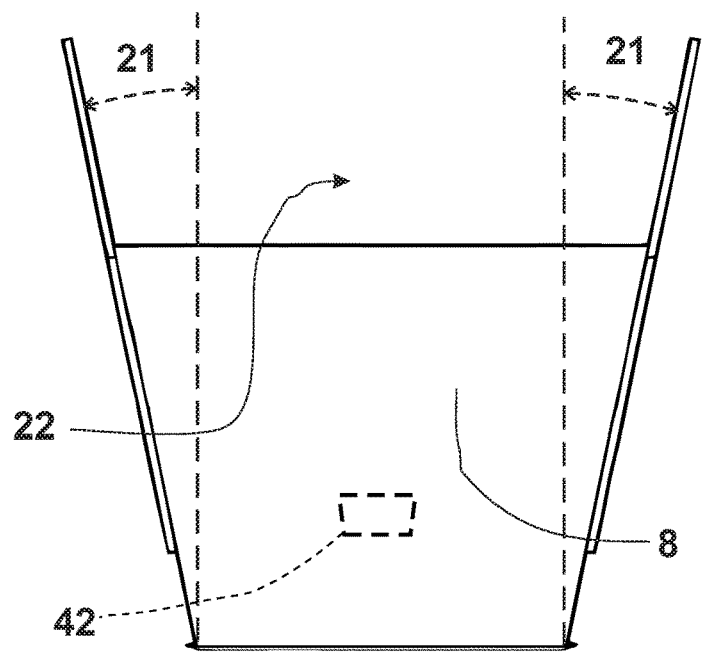

FIG. 17 is substantially the same rear elevational view shown in FIG. 16 with angles marked.

Figure 18:
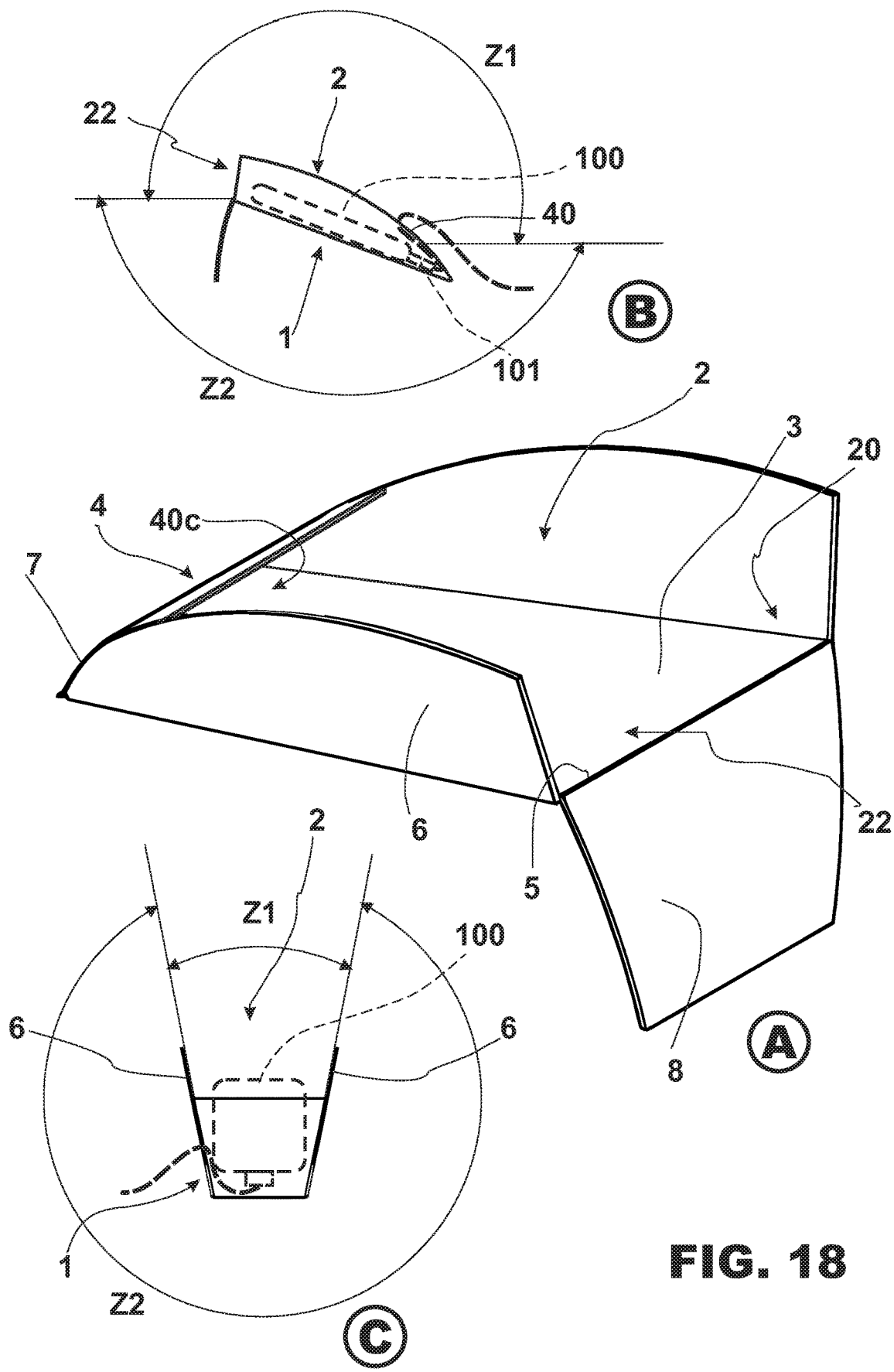

FIG. 18 represents a second alternate embodiment of the present invention, including A, B, and C, showing:

View A is a perspective view of a second alternate embodiment for the present shield bracket of electromagnetic waves for communication devices, in which its support edge defines a housing cavity;

View B, is a side elevational view of the second alternate embodiment for the present invention represented in view A; and View C, is a rear elevational view of the second alternate embodiment for the present invention indicating the protection zones and areas of emission of electromagnetic waves.

Figure 19:
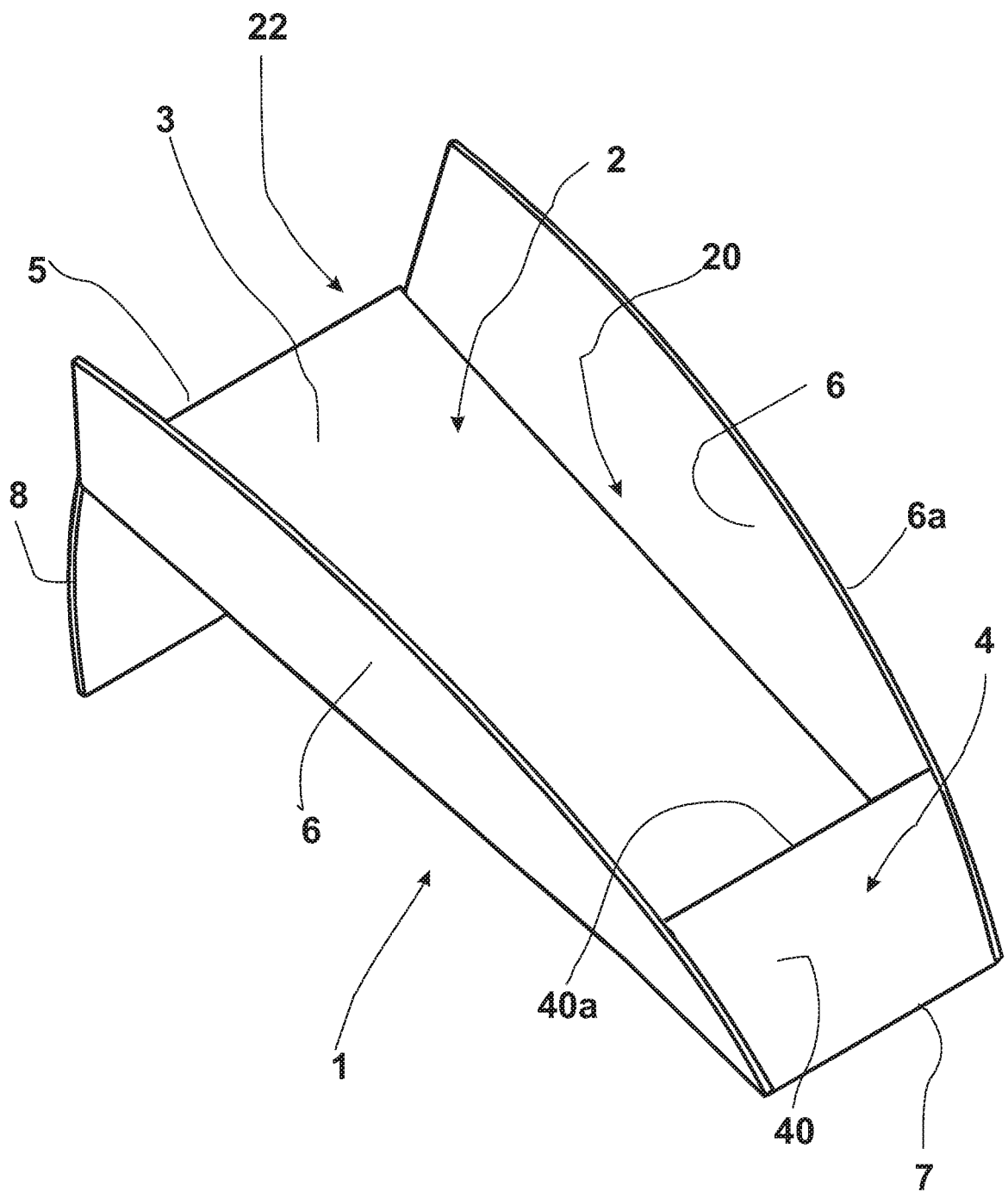

FIG. 19 is a front perspective view of the second alternate embodiment seen in FIG. 18.

Figure 20:
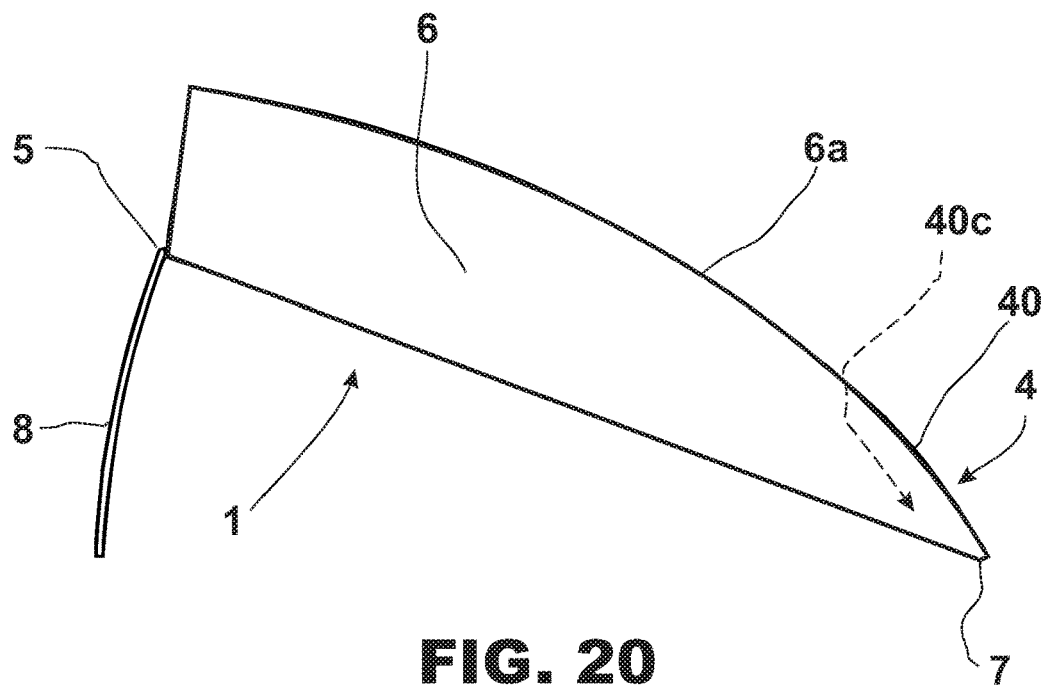

FIG. 20 is a side elevational view of the second alternate embodiment for the present invention showing the shape of its side screen walls.

Figure 21:
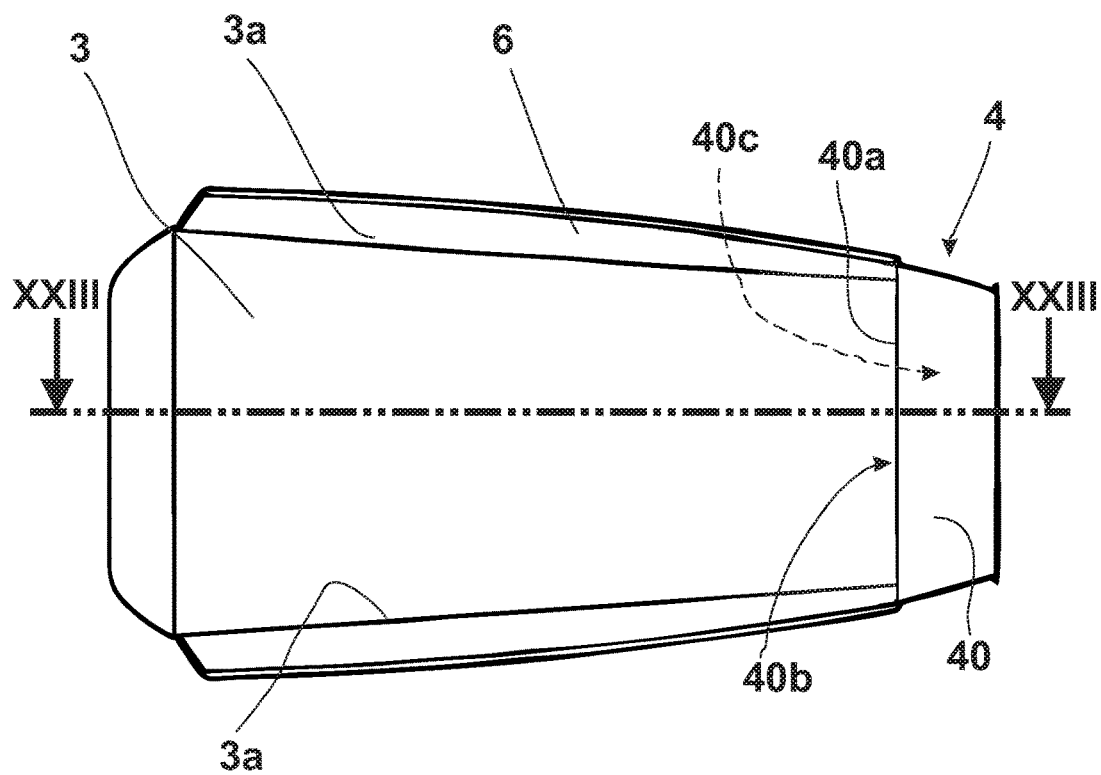

FIG. 21 is a top view of the second alternate embodiment for the present invention showing the shape of the different walls extending from the main support wall.

Figure 22:
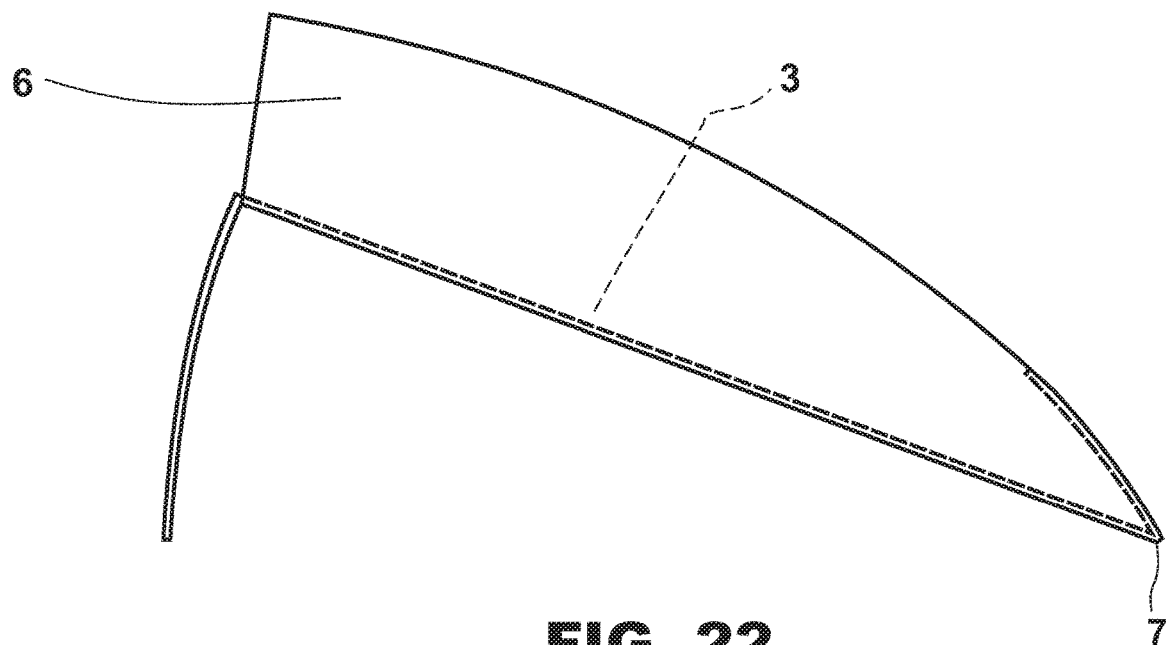

FIG. 22 is a side elevational view of the second alternate configuration for the present invention.

Figure 23:
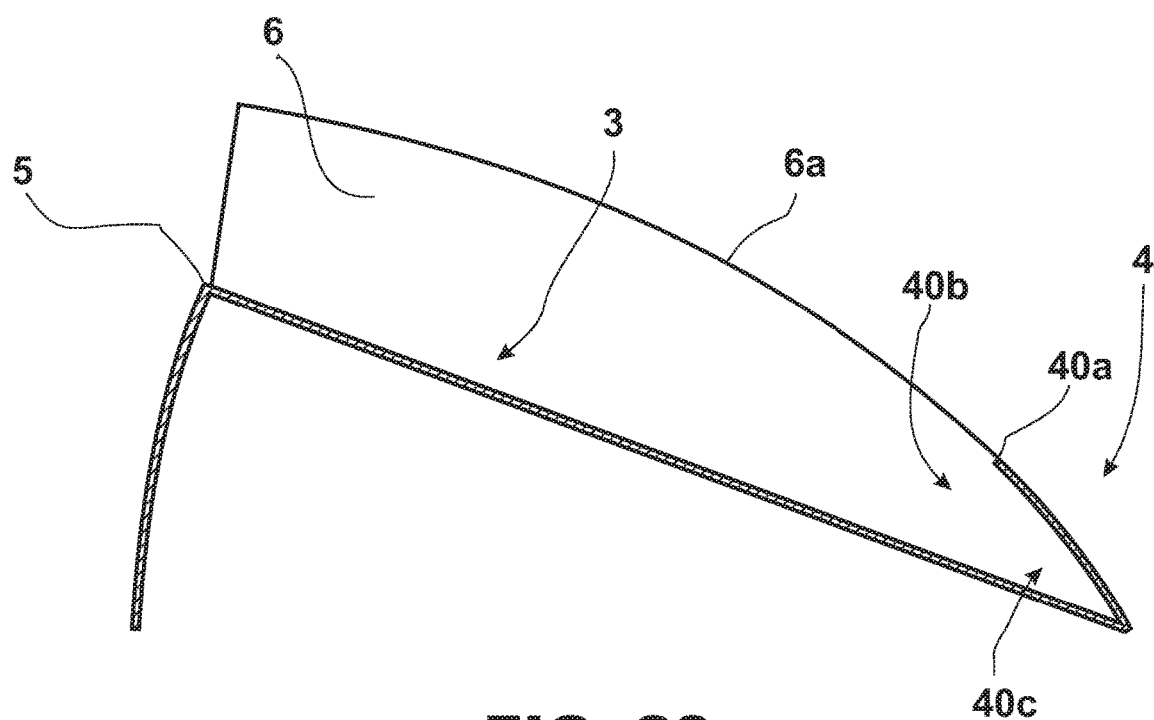

FIG. 23 is a cross-section view taking along line XXIII-XXIII from FIG. 21.

Figure 24:
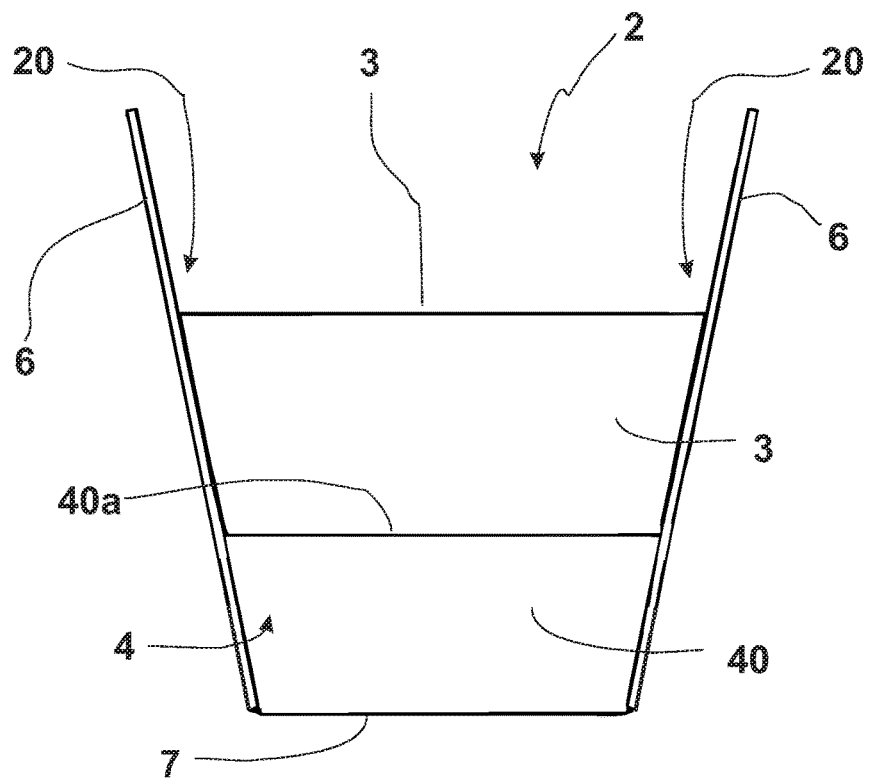

FIG. 24 is a rear elevational view of the second alternate embodiment for the present invention.

Figure 25:
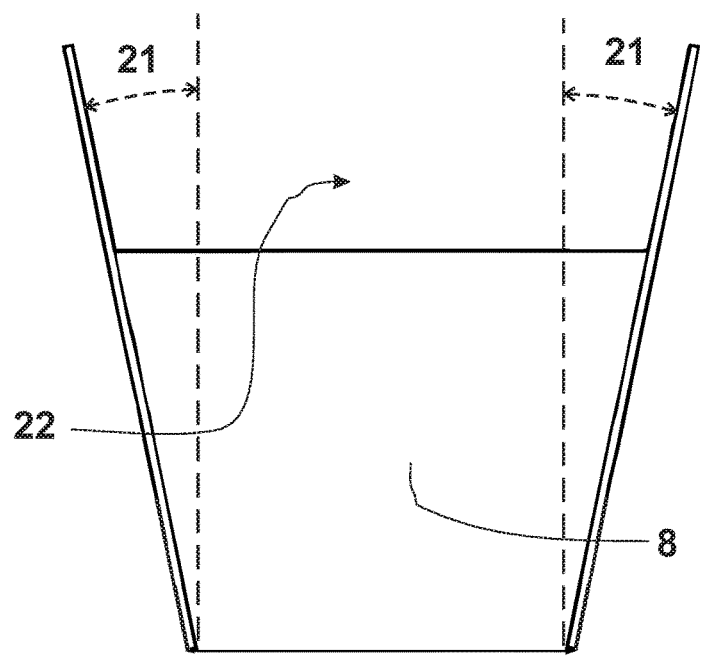

FIG. 25 is substantially the same rear elevational view shown in FIG. 24 with angles marked.

Figure 26:
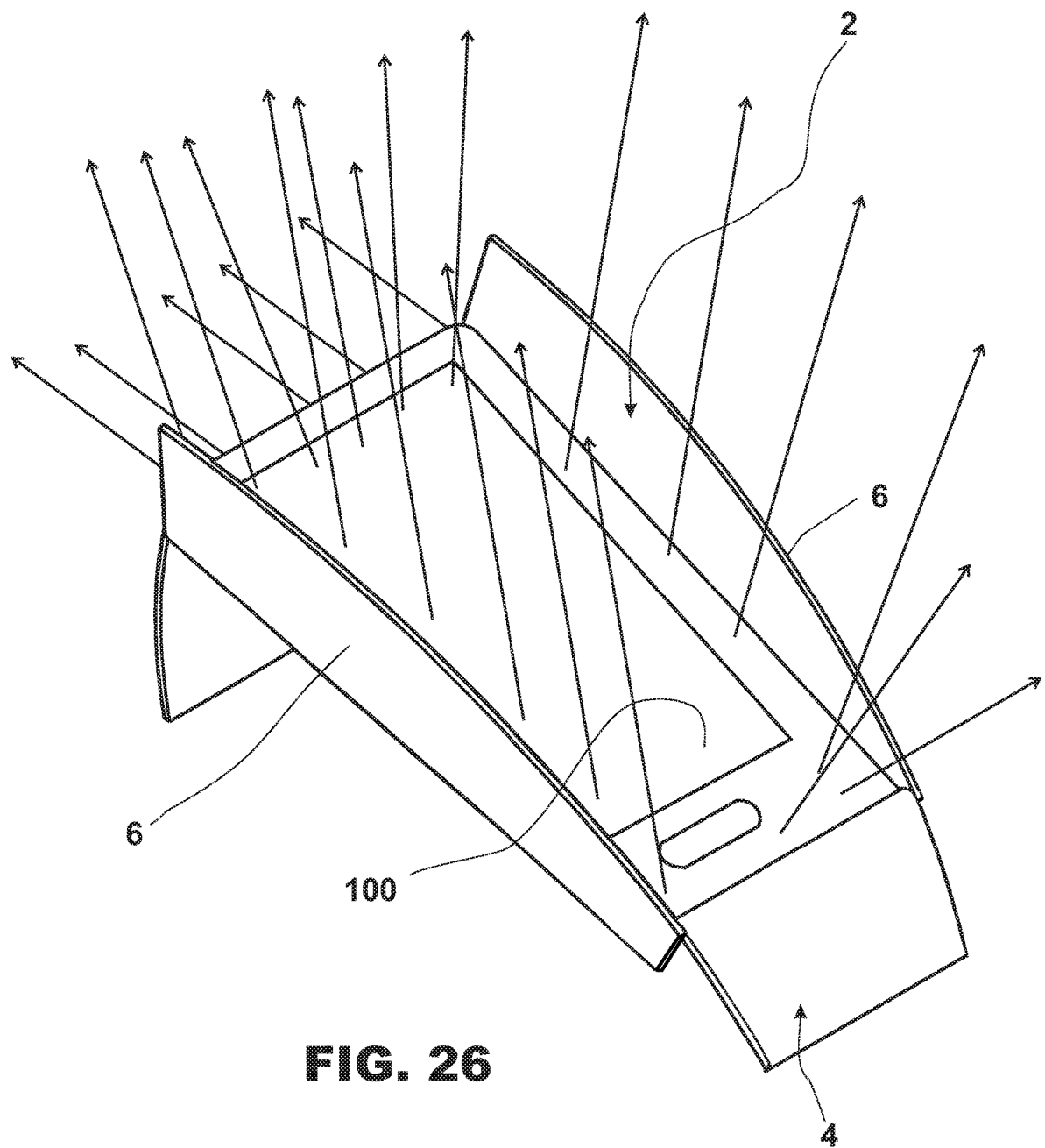

FIG. 26 is a perspective view of the invention showing a communication devise housed therein and the electromagnetic waves have been represented with arrows, except for the area protected by the invention walls.

Figure 1:
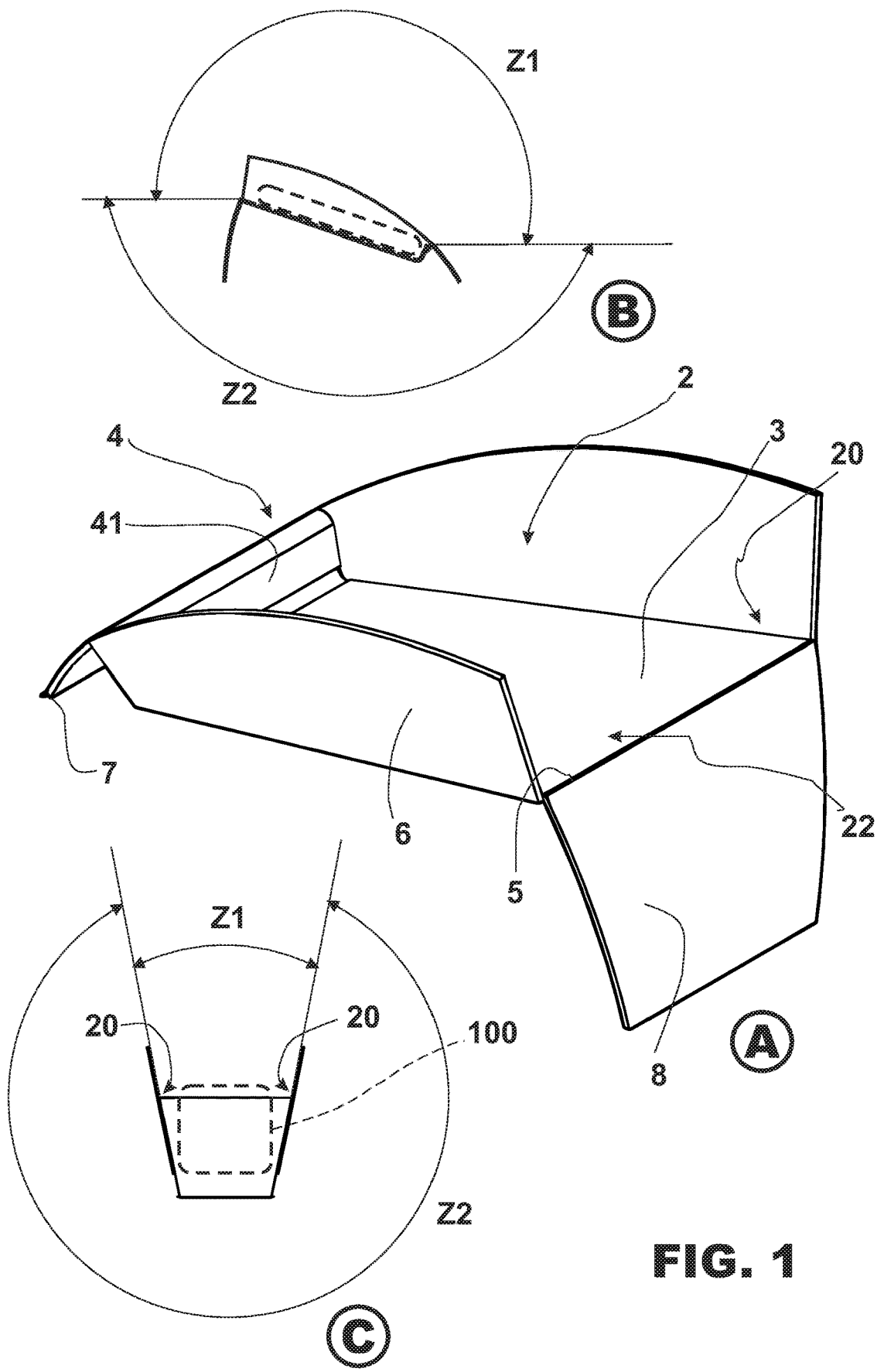
FIG. 1 represents the present invention, including A, B, and C, showing.
Figure 27:
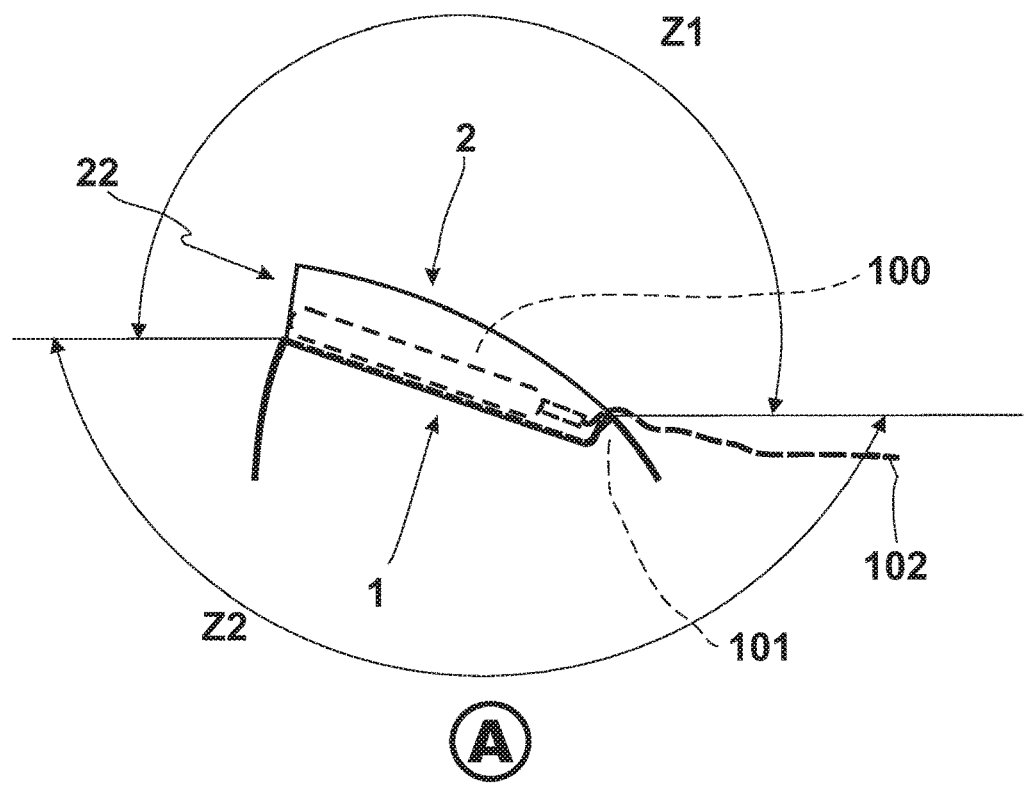
Figure 27:
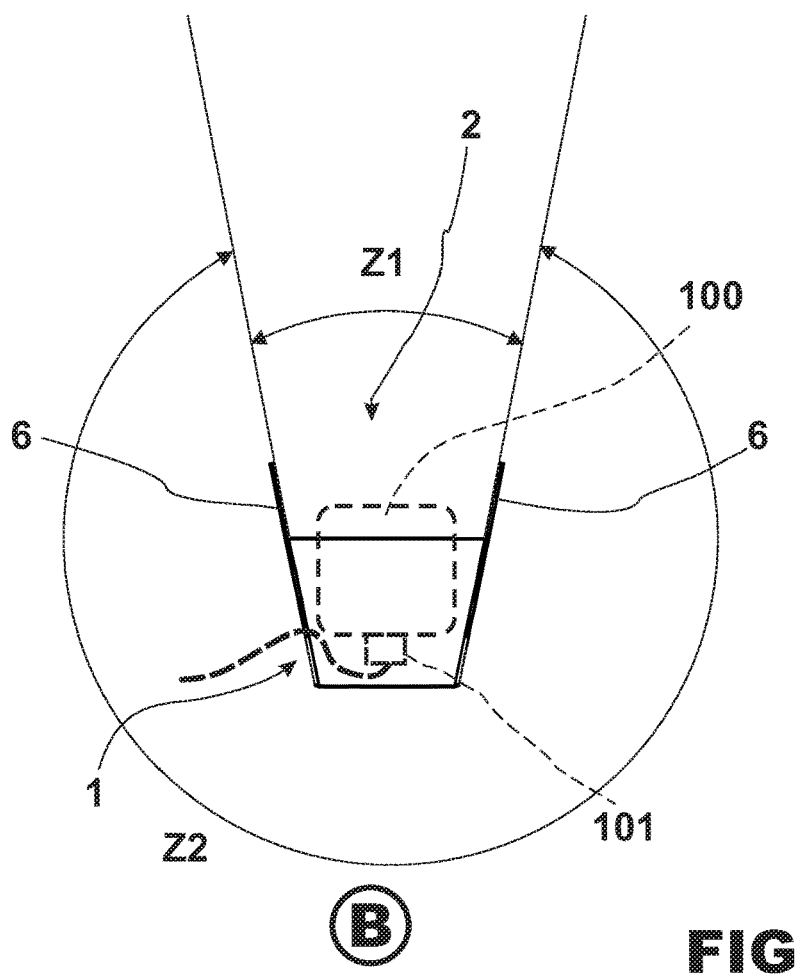

FIG. 27 represents the present invention, including A, and B, showing:

View A, is a side elevational view of the preferred embodiment of the invention represented in FIG. 1, showing the protection zones and areas of emission of electromagnetic waves; and View B, is a rear elevational view of the invention indicating the protection zones and areas of emission of electromagnetic waves.

Figure 28:
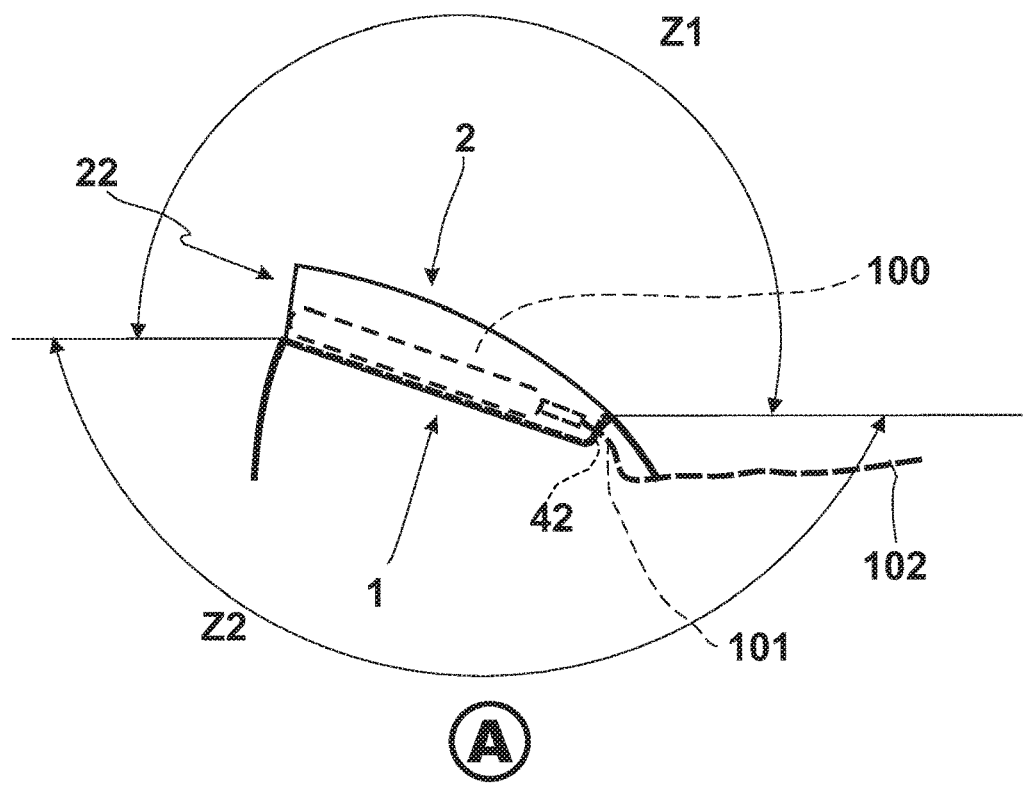
Figure 28:
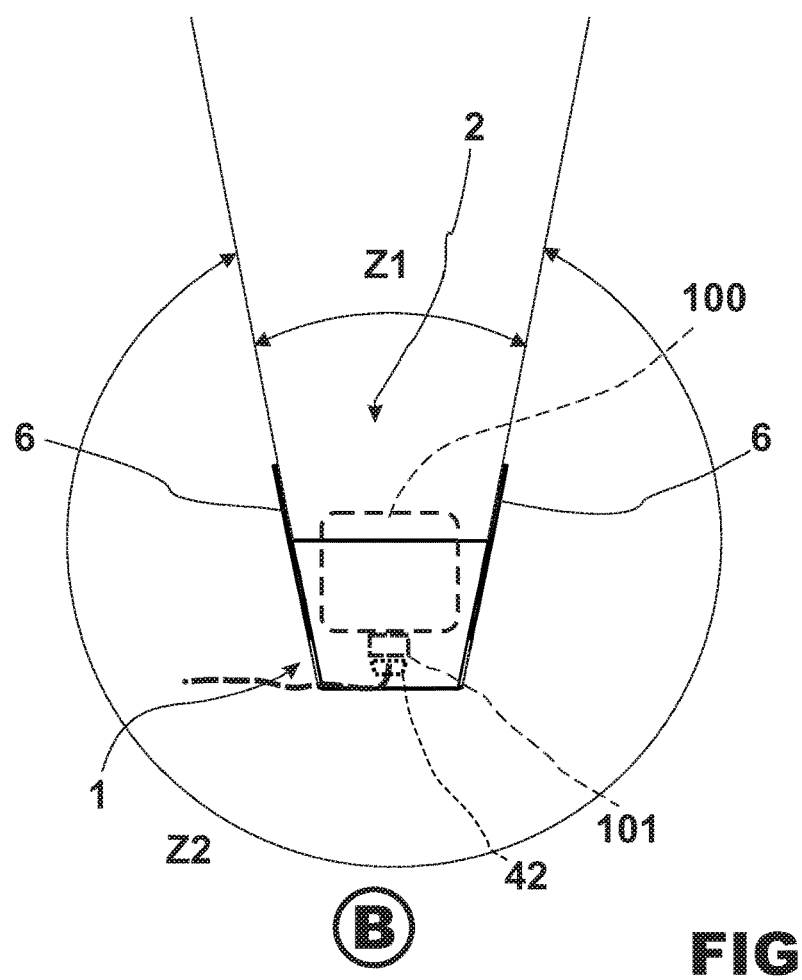

FIG. 28 represents the first alternate embodiment of the present invention, including A, and B, showing:

View A, is a side elevational view of first alternate embodiment of the invention represented in FIG. 9, showing the protection zones and areas of emission of electromagnetic waves; and View B, is a rear elevational view of the invention indicating the protection zones and areas of emission of electromagnetic waves.

Figure 29:
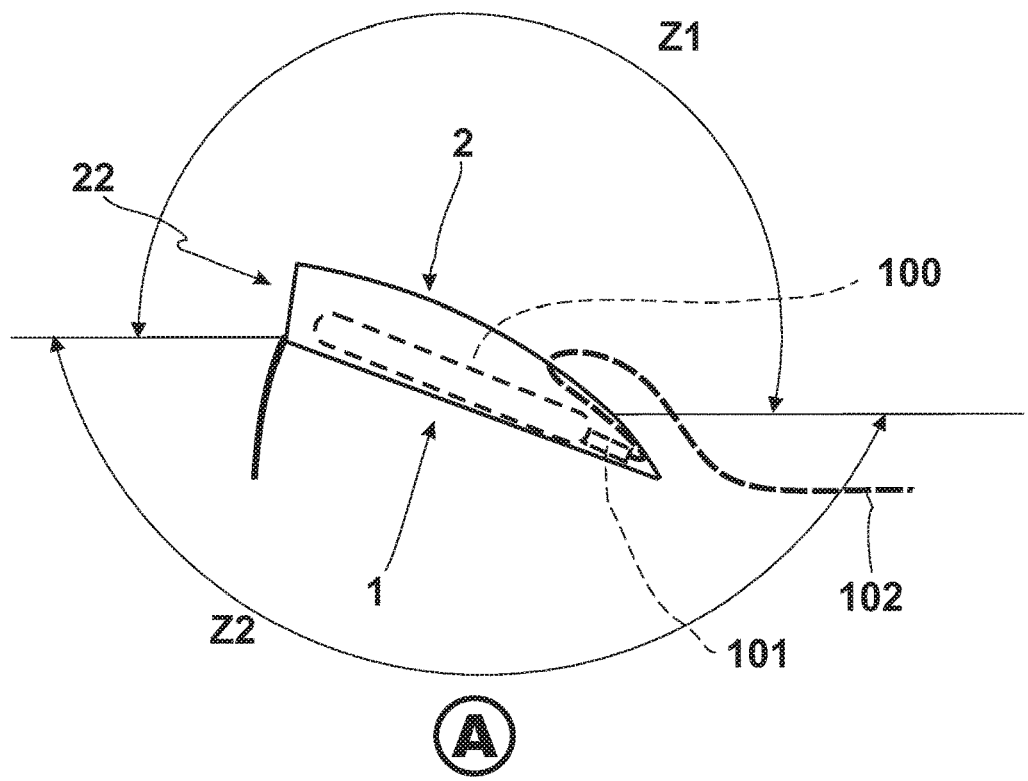
Figure 29:
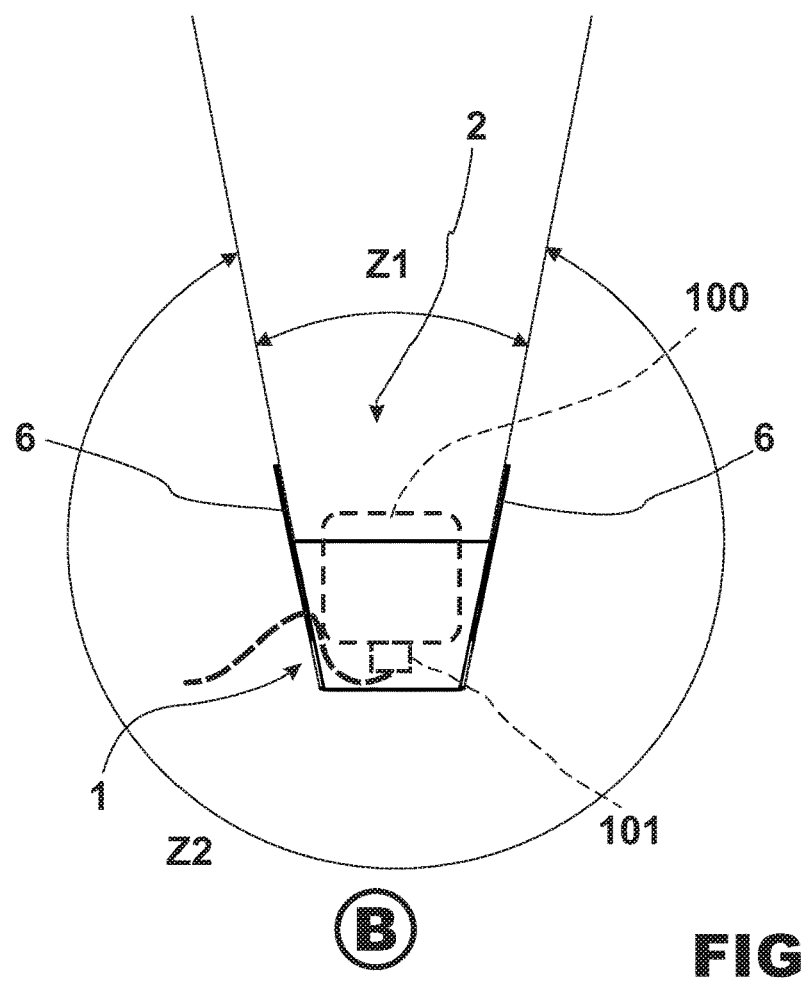

FIG. 29 represents the first alternate embodiment of the present invention, including A, and B, showing:

View A, is a side elevational view of first alternate embodiment of the invention represented in FIG. 18, showing the protection zones and areas of emission of electromagnetic waves; and View B, is a rear elevational view of the invention indicating the protection zones and areas of emission of electromagnetic waves.

In the different illustrations, the same numbers and/or letters of reference indicate same parts.

LIST OF THE REFERENCES MENTIONED IN THE DRAWINGS

1 Support structure
2 Open receptacle
3 Main supporting wall
3a Side ends
4 Containment structure
5 Edge
6 Sidewalls
6a Upper edges [of sidewalls 6]
7 Shorter leg wall
8 Larger leg wall
20 Lateral manipulation space
21 angle [angle of the sidewalls 6 with respect to the main supporting wall 3]
22 End aperture
40 Partial cover wall
40a Upper edge
40b Aperture
40c Cavity
41 End supporting wall
41a Lower end [of the end supporting wall]
41b Intermediate portion [of the end supporting wall]
41c Upper end [of the end supporting wall]
42 Connection passage
100 Communication device [emitter of electromagnetic waves]
101 Charging connector
102 Charging cable
Z1 Zone of emission of electromagnetic waves [emitted by communication device 100]
Z2 Zone of protection from electromagnetic waves [emitted by communication device 100]

DETAILED DESCRIPTION OF THE PREFERRED EMBODIMENT

Referring now to the drawings, it can be observed that the shield bracket of electromagnetic waves for communication devices, object of the present application, basically includes an open receptacle 2 defined by a support structure 1.

The present shield bracket serves as means for supporting and partially blocking the emission of electromagnetic waves from communication devices 100.

In the preferred embodiment shown in FIGS. 1 to 8, support structure 1 includes main supporting wall 3, containment structure 4, sidewalls 6, shorter leg wall 7 and larger leg wall 8.

Main supporting wall 3 has side ends 3a and edge 5. Containment structure 4 comprises end supporting wall 41. End supporting wall 41 extends upwardly from main supporting wall 3. End supporting wall 41 includes lower end 41a, intermediate portion 41b and upper end 41c. Lower end 41a is connected to main supporting wall 3 opposite to edge 5. Shorter leg wall 7 extends from upper end 41c at a predetermined angle. Sidewalls 6 also extend upwardly from main supporting wall 3. Sidewalls 6 have upper edges 6a. One end of sidewalls 6 connects the lateral edges of end supporting wall 41. The opposite ends of sidewalls 6 with edge 5 defines end aperture 22. Larger leg wall 8 extends downward from edge 5.

Sidewalls 6 are projected beyond open receptacle 2 and, therefore, beyond the height of end supporting wall 41. Sidewalls 6 are made of aluminum so they constitute barriers to the emission of electromagnetic waves coming from communication devices 100 which it supports when the invention is in use. Containment structure 4 is structured to receive and support communication devices 100, such as cell phones.

As best seen in FIG. 8, angle 21 is defined by the angle of sidewalls 6 with respect to the vertical position. Angle 21 is within a range of 90°-135°, preferably. Such angle defines lateral manipulation space 20 as a space between communication devices 100 and sidewalls 6, as best seen in FIGS. 1C, 9C and 18C. When communication device 100 is accommodated within open receptacle 2, lateral manipulation space 20 helps the user to accommodate, remove and/or manipulate communication device 100 within open receptacle 2.

In the preferred embodiment of the invention, the connection of main supporting wall 3 with lower end 41a is curved, as best represented in FIGS. 5 and 6.

As seen in FIGS. 9 to 17, a first alternate embodiment of the present invention, in addition to the above-mentioned parts and features, it also comprises connection passage 42 disposed at end supporting wall 41. Charging cable 102, which is connected to charging connector 101, goes through connection passage 42 when communication device 100 is accommodated within open receptacle 2.

As seen in FIGS. 18 to 25, in the second alternate embodiment of the present invention, in addition to the parts and features above-mentioned for the preferred embodiment of the invention, partial cover wall 40, which extends upwardly from upper end 41c, is secured to the proximal portion of upper edges 6a. In this configuration containment structure 4, upper edge 40a of partial cover wall 40 defines aperture 40b and cavity 40c, as best seen in FIGS. 21 and 23. Accordingly, the Containment structure 4 securely houses the lower portion of communication device 100 within open receptacle 2. Also, charging connector 101 may be housed within open receptacle 2. When charging connector 101 is connected to communication device 100, charging cable 102, go around upper edge 40*a* of partial cover wall 40, as best seen in FIGS. 18 B and C. The joint of main supporting wall 3 with partial cover wall 40 acts as shorter leg wall 7.

Aperture 22 facilitates the user to house, accommodate, remove and/or manipulate communication device 100 within open receptacle 2.

The sloping angle of main supporting wall 3 is determined by the different height of shorter leg wall 7 and larger leg wall 8.

As best seen in FIGS. 8, 17 and 25, sidewalls 6 extend divergently at angle 21 with respect to the vertical position. Divergent angle 21 is within a range of 90°-135° with respect to main supporting wall 3, preferably. Such angle defines lateral manipulation space 20 as a space between communication devices 100 and sidewalls 6, as also seen in FIGS. 1C, 9C and 18C. When communication device 100 is accommodated within open receptacle 2, lateral manipulation space 20 helps the user to accommodate, remove and/or manipulate communication device 100 within open receptacle 2.

As seen in FIG. 26, sidewalls 6 extend higher than communication device 100 when the later is laid on main supporting wall 3.

Sidewalls 6 function as barriers to the emission of electromagnetic waves generated by communication device 100, when it is housed within open receptacle 2. To comply with this function, sidewalls 6 are structured in aluminum. Preferably, it is used 1000 series aluminum alloys (99% aluminum with no major alloying additions), such as 1100 aluminum (commercially pure aluminum). With respect to the thickness of sidewalls 6, it should be, preferably in the range, but not limited to, 1.2-2.5 mm. In addition to be made of a suitable material acting as a barrier for emission of electromagnetic waves, sidewalls 6 are covered with other materials such as plastics, rubber, paint, etc. for exterior protection and/or aesthetic purposes. In addition to sidewalls 6, structured aluminum with the same characteristics is recommended to be implemented in main supporting wall 3, containment structure 4, partial cover wall 40 and end supporting wall 41 to enhance the protection capability of the invention against the emission of electromagnetic waves.

Under these conditions, the emission of electromagnetic waves is blocked by main supporting wall 3, sidewalls 6, and supporting wall 41.

Considering that the above-mentioned features defining the barrier function against the emission of electromagnetic waves, the height and/or angle 21 of sidewalls 6 are intended to configure zone of protection from electromagnetic waves Z2, as best seen in FIGS. 27, 28 and 29.

These configurations limit zone of emission of electromagnetic waves Z1 from communication device 100 and creates a wider zone of protection from electromagnetic waves Z2.

Upper edges 6*a* of sidewalls 6 are of a convenient substantially convex shape to enhance protection at the central portion, being higher at the center while they are of a lower height at the ends to do not difficult the handling of communication device 100.

Sidewalls 6 may be fixedly mounted to side ends 3*a* of main supporting wall 3, larger leg wall 8 may be fixedly mounted to edge 5, end supporting wall 41 may be fixedly mounted to lower end 41*a*, and shorter leg wall 7 may be fixedly mounted to upper end 41*c*. Alternatively, they can be structured using an aluminum laminar sheet with the same configuration. When the invention is configured from an aluminum laminar sheet, it can be properly folded at side ends 3*a*, edge 5, lower end 41*a*, and upper end 41*c*, to define main supporting wall 3, sidewalls 6, larger leg wall 8, supporting wall 41 and shorter leg wall 7, respectively, as best represented in FIGS. 5, 6, 14, 15, 22 and 23.

Other configurations for the shield bracket of electromagnetic waves for communication devices may include means for mounting to structures, walls, furniture, vehicles, etc. These means may include, but are not limited to, removable/portable mounting devices such as magnets, fastenings, etc.

The foregoing description conveys the best understanding of the objectives and advantages of the present invention. Different embodiments may be made of the inventive concept of this invention. It is to be understood that all matter disclosed herein is to be interpreted merely as illustrative, and not in a limiting sense.

What is claimed is:

1. A shield bracket of electromagnetic waves for communication devices, consisting of:
   A) an open receptacle structured to house and support a communication device;
   B) a main supporting wall having first and second side ends, an open edge and an end, said end being opposite to said open edge, said first and second side ends being longer than said open edge and said end;
   C) a containment structure having an end supporting wall, said end supporting wall being connected to said end of said main supporting wall, said main supporting wall having a sloping angle that tilts to said containment structure;
   D) first and second sidewalls having respective upper edges, each of said first and second sidewalls further having first and second lateral ends, said first and second sidewalls extending upwardly from respective said first and second side ends of said main supporting wall at divergent angles, and said first and second sidewalls extending beyond a first height of said containment structure, said first and second sidewalls are made of aluminum, said first and second sidewalls being longer than said end supporting wall; and
   E) first and second leg walls, said first leg wall extending from said open edge, said second leg wall extending from said end supporting wall, said second leg wall being shorter than said first leg wall, said sloping angle is defined by a second height of said first leg wall and a third height of said second leg wall, a fourth and fifth height of respective said first and second sidewalls and said divergent angles define an electromagnetic wave protection zone, said first and second sidewalls being longer than a width of said first and second leg walls, further characterized in that said end supporting wall has a connection passage, the first and second sidewalls have protection covering materials including one of plastics, rubber or paint; and
   F) further having a partial cover wall defining a housing for the lower portion of said communication device, a charging connector and a cable connected to said communication device, said partial cover wall is secured to said respective upper edges of said first and second sidewalls.

2. The shield bracket of electromagnetic waves for communication devices set forth in claim 1, further characterized in that said open receptacle further having an aperture defined by said first and second lateral ends of said first and second sidewalls respectively and said open edge of said main supporting wall.

3. The shield bracket of electromagnetic waves for communication devices set forth in claim 1, further characterized in that said main supporting wall and said containment structure are made of aluminum.

4. The shield bracket of electromagnetic waves for communication devices set forth in claim 3, further characterized in that said aluminum is aluminum series 1000.

5. The shield bracket of electromagnetic waves for communication devices set forth in claim 4, further characterized in that said aluminum series 1000 is aluminum 1100.

6. The shield bracket of electromagnetic waves for communication devices set forth in claim 5, further characterized in that said aluminum is of a thickness in the range of 1.2-2.5 mm.

7. The shield bracket of electromagnetic waves for communication devices set forth in claim 1, further characterized in that said divergent angles are defined by a first angle between said first sidewall with respect to said main supporting wall and a second angle between said second sidewall with respect to said main supporting wall, whereby said divergent angles are in the range of 93°-130° to define a lateral manipulation space.

8. The shield bracket of electromagnetic waves for communication devices set forth in claim 1, further characterized in that said first and second sidewalls are fixed to said first and second side ends respectively.

9. The shield bracket of electromagnetic waves for communication devices set forth in claim 1, further characterized in that said first and second upper edges are of a convex shape.

* * * * *